(12) United States Patent
Prabhakar et al.

(10) Patent No.: US 9,378,821 B1
(45) Date of Patent: Jun. 28, 2016

(54) ENDURANCE OF SILICON-OXIDE-NITRIDE-OXIDE-SILICON (SONOS) MEMORY CELLS

(71) Applicant: Cypress Semiconductor Corporation, San Jose, CA (US)

(72) Inventors: Venkatraman Prabhakar, Pleasanton, CA (US); Long Hinh, San Jose, CA (US); Kaveh Shakeri, Campbell, CA (US); Sarath C. Puthenthermadam, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 10 days.

(21) Appl. No.: 13/791,758

(22) Filed: Mar. 8, 2013

Related U.S. Application Data

(60) Provisional application No. 61/754,044, filed on Jan. 18, 2013.

(51) Int. Cl.
*G11C 16/10* (2006.01)
*G11C 16/12* (2006.01)
*G11C 16/14* (2006.01)
*G11C 16/16* (2006.01)

(52) U.S. Cl.
CPC ........................ *G11C 16/10* (2013.01)

(58) Field of Classification Search
CPC .... G11C 16/10; G11C 16/102; G11C 16/105; G11C 16/107; G11C 16/12; G11C 16/14; G11C 16/16
USPC ........................ 365/185.18, 185.19
See application file for complete search history.

(56) References Cited

U.S. PATENT DOCUMENTS

| 5,885,870 | A | 3/1999 | Maiti et al. | |
|---|---|---|---|---|
| 6,040,996 | A * | 3/2000 | Kong | 365/185.19 |
| 6,160,739 | A | 12/2000 | Wong | |
| 7,133,313 | B2 * | 11/2006 | Shih | 365/185.18 |
| 7,366,026 | B2 | 4/2008 | Lee et al. | |
| 7,545,684 | B2 | 6/2009 | Nakagawa et al. | |
| 7,816,727 | B2 | 10/2010 | Lai et al. | |
| 7,859,904 | B1 * | 12/2010 | Jenne et al. | 365/185.18 |
| 8,223,552 | B2 | 7/2012 | Fujiki et al. | |
| 2003/0095439 | A1 | 5/2003 | San et al. | |
| 2004/0264264 | A1 * | 12/2004 | Yaegashi et al. | 365/199 |

(Continued)

FOREIGN PATENT DOCUMENTS

WO 2008058264 A2 5/2008

OTHER PUBLICATIONS

Arreghini, A. et al. (May 2008). "Experimental Characterization of the Vertical Position of the Trapped Charge in Si Nitride-Based Nonvolatile Memory Cells," IEEE Transaction 55(5):1211-1219.
Yeh, C.C. et al. (2003). "Novel operation schemes to improve device reliability in a localized trapping storage SONOS-type flash memory," IEEE Xplore, download from http://ieeexplore.ieee.org/xpl/articalDetails.jsp?reload=true&arnumber . . . , 1 page.

(Continued)

*Primary Examiner* — Huan Hoang
*Assistant Examiner* — Muna A Techane

(57) ABSTRACT

Apparatuses and methods of pulse shaping a pulse signal for programming and erasing a Silicon-Oxide-Nitride-Oxide-Silicon (SONOS) memory cell are described. In one method a pulse shape of a pulse signal is controlled to include four or more phases for programming or erasing a SONOS memory cell. A write cycle is performed to program or erase the SONOS memory with the pulse signal with the four or more phases.

14 Claims, 10 Drawing Sheets

(56) References Cited

U.S. PATENT DOCUMENTS

| | | | |
|---|---|---|---|
| 2006/0056240 A1* | 3/2006 | Shappir et al. ............ | 365/185.29 |
| 2006/0160305 A1* | 7/2006 | Mokhlesi .............. | H01L 27/115 438/257 |
| 2007/0115729 A1* | 5/2007 | Chen ......................... | 365/185.29 |
| 2008/0273392 A1* | 11/2008 | Ratnakumar et al. .... | 365/185.19 |
| 2008/0290400 A1 | 11/2008 | Jenne et al. | |
| 2008/0291736 A1* | 11/2008 | Dong et al. .............. | 365/185.19 |
| 2010/0080065 A1* | 4/2010 | Fujiki et al. .............. | 365/185.19 |
| 2011/0286279 A1* | 11/2011 | Lei et al. ................... | 365/185.19 |
| 2012/0026798 A1* | 2/2012 | Hisamoto et al. ........ | 365/185.19 |
| 2013/0141982 A1* | 6/2013 | Park et al. ................ | 365/185.19 |

OTHER PUBLICATIONS

Kim, K. et al. (2011). "Future memory technology and ferroelectric memory as an ultimate memory solution," www.intechopen.com, 117-157.

Cai, Y. et al. "Program/erase injection current characteristics of a low-voltage low-power NROM using high-K materials as the tunnel dielectric," 3 pages.

Bu, J. et al. (2001). "Design considerations in scaled SONOS nonvolatile memory devices," Solid-State Electronics 45:113-120.

Search Report for "Improving Endurance of Silicon-Oxide-Nitride-Oxide-Silicon (SONOS) Memory Cells", dated Jan. 2013, 16 pages.

* cited by examiner

ENDURANCE OF SILICON-OXIDE-NITRIDE-OXIDE-SILICON (SONOS) MEMORY CELLS

RELATED APPLICATIONS

This application also claims the benefit of U.S. Provisional Application No. 61/754,044, filed Jan. 18, 2013, the entire contents of which is hereby incorporated by reference.

TECHNICAL FIELD

The present disclosure relates generally to Silicon-Oxide-Nitride-Oxide-Silicon (SONOS) memory cells, and more particularly to endurance improvement of SONOS memory cells.

BACKGROUND

Nonvolatile memories (NVM) retain stored information even if the power supply to the memory is switched off. There are different types of nonvolatile memories including Flash, read-only memory (ROM), one-time programmable (OTP), and multiple-time programmable (MTP) memories. Flash memory is the most versatile because it can be programmed and erased thousands of times with no degradation in the sense margin and data retention performance. Two types of NVMs are floating gate and SONOS.

A floating gate in a metal-oxide-semiconductor field-effect transistor (MOSFET) is used to store the charge. That is the floating gate is sandwiched in between the channel and the control gate. The method of injecting (programming of memory) and removing (erasing of memory) charge from the floating gate can be different and has led to different families of Flash memory. SONOS is a type of NVM closely related to Flash RAM, but is distinguished by the use of silicon nitride instead of polysilicon for the charge storage material. One SONOS memory cell is formed from a standard polysilicon N-channel MOSFET transistor with the addition of a small sliver of silicon nitride inserted inside the transistor's gate oxide. The sliver of nitride is non-conductive but contains a large number of charge trapping sites able to hold an electrostatic charge. The nitride layer is electrically isolated form the surrounding transistor, although charges stored on the nitride directly affect the conductivity of the underlying transistor channel. The SONOS charge storage layer may be composed of multiple dielectric layers. Hence, the "nitride" layer as described below can include several nitride layers and may also include nitrides with modified composition including addition of oxygen or silicon. Although it is called SONOS, it is not limited to ONO. The SONOS memory cell can have other structures like ONONO or other combinations. When the polysilicon control gate is biased positively, electrons from the transistor source and drain regions tunnel through the oxide layer and get trapped in the silicon nitride. This results in an energy barrier between the drain and the source, raising the threshold voltage VT (the gate-source voltage necessary for current to flow through the transistor). The electrons can be removed again by applying a negative bias on the control gate, either by de-trapping electrons or by tunneling holes into the charge trapping layer. SONOS uses lower programming voltages and higher program/erase cycle endurance than polysilicon-based flash memory A key requirement for an NVM cell is reliability. The End-of-life (EOL) VT window is determined by the degradation caused by program/erase cycles (Endurance) and VT decay during storage (Data retention). Endurance is typically characterized by cycling a SONOS cell through the required number of program/erase cycles and measuring the shift of program voltage threshold (VTP) and erase voltage threshold (VTE). Retention is characterized by taking the SONOS cell through a fixed number of program/erase cycles and then measuring the change of VT (program or erase) with time at an elevated temperature. SONOS can be integrated at many of the technology nodes, such as 130 nm, 90 nm or 65 nm or the like. Endurance of SONOS degrades after about 10K cycles in scaled SONOS stacks such as used in 65 nm technology and other advanced technologies. This makes it difficult to achieve 100K/lM endurance cycle specs from EEPROM emulation and NVSRAM applications.

BRIEF DESCRIPTION OF THE DRAWINGS

The present invention is illustrated by way of example, and not of limitation, in the figures of the accompanying drawings in which.

DETAILED DESCRIPTION

Figure 1:
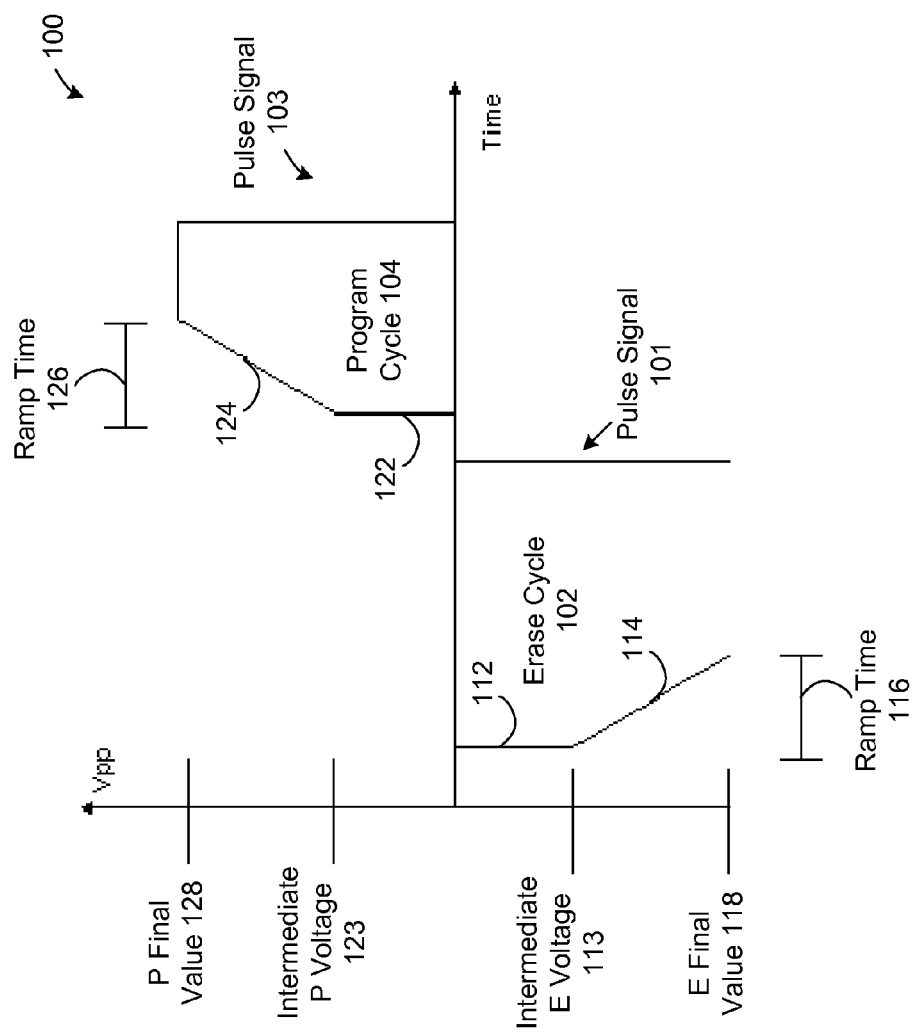
FIG. 1 illustrates pulse shaping using ramped pulses with two different ramp rates for programming and erasing a SONOS memory cell according to one embodiment.

In the following description, for purposes of explanation, numerous specific details are set forth in order to provide a thorough understanding of the present invention. It will be evident, however, to one skilled in the art that the present invention may be practiced without these specific details. In other instances, well-known circuits, structures, and techniques are not shown in detail, but rather in a block diagram in order to avoid unnecessarily obscuring an understanding of this description.

Reference in the description to "one embodiment" or "an embodiment" means that a particular feature, structure, or characteristic described in connection with the embodiment is included in at least one embodiment of the invention. The phrase "in one embodiment" located in various places in this description does not necessarily refer to the same embodiment.

Apparatuses and methods of pulse shaping a pulse signal for programming and erasing a Silicon-Oxide-Nitride-Oxide-Silicon (SONOS) memory cell are described. In one method a pulse shape of a pulse signal is controlled to include four or more phases for programming or erasing a SONOS memory cell. A write cycle is performed to program or erase the SONOS memory with the pulse signal with the four or more phases.

As described above, the EOL VT window is determined by the degradation caused by program/erase cycles (Endurance) and VT decay during storage (Data retention). Endurance is typically characterized by cycling a SONOS cell through the required number of program/erase cycles and measuring the shift of VTP and VTE. Retention is characterized by taking the SONOS cell through a fixed number of program/erase cycles and then measuring the change of VT (program or erase) with time at an elevated temperature. Endurance of SONOS degrades after about 10K cycles in scaled SONOS stacks such as used in 65 nm technology and other advanced technologies. Endurance specifications could be met on 0.13 micron technologies, but the ONO stack in 65 nm technology is very thin and easily damaged. That is previous solutions relied on intrinsic properties of ONO stack and do not work for scaled stacks with program/erase at low voltages needed for advanced technologies, such as 64 nm, 28 nm, and so on. For example, 1M cycles need for NVSRAM may not be achievable with standard pulse on 65 nm SONOS memory cells.

The embodiments described herein use program/erase pulse shaping on SONOS memory cells to reduce endurance cycling damage on the SONOS memory cells. Program/erase (P/E) pulse shaping has not been used in SONOS technologies previously. The embodiments described herein may reduce damage due to cycling and also improve retention after endurance, allowing the SONOS memory cells to be used in 100K/1M cycle applications. In effect, the pulse shaping reduces an electric field for a specific amount of charge during a write cycle. The pulse shape can include more than the typical three phases of a pulse signal, including a rising phase, holding phase and falling phase of the pulse signal. Rather, the pulse shape can be controlled to include four or more phases, such as two rising phases at different ramp rates, a holding phase and a falling phase, or multiple pulses of three phases, the multiple phases increasing in magnitude over time, or the like. Of course, raising and failing phases can be reversed for erasing or different conventions can be used for programming and erasing. In floating gate programming, conventional solutions focus on the final programming voltage or final erasing voltage do not exceed specified values to prevent over programming (i.e., how much charge to add to the floating gate). If exceeded, the SONOS memory cell may need to be erased and reprogrammed for example. The embodiments described herein control a flow of charge in or out of a charge trapping layer of the SONOS memory cell so that the charge trapping layer is charged or discharged to a specified value, but the rate at which the charge is introduced or removed from the charge trapping layer is controlled using pulse shaping to gradually introduce or remove an electric field during the write cycle. In this way, the total electric charge is minimized while still achieving the threshold voltage (e.g., final P voltage or final E voltage). This helps for both retention and endurance.

Using the standard P/E pulse (e.g., 7.39 V/−7.35V, 2 msec program time, 6 msec erase time, and 100 μsec rise/fall time) with a temperature coefficient at 85° C., the SONOS memory cell is significantly degraded by endurance cycling of one million (1M) cycles. The un-cycled device EOL window is 1.21 V after 85° C. 10 years. The corresponding window after 1M cycles is from the same wafer is 1.08 V even with a reduced retention time of 2 years at 85° C.

By controlling a pulse shape of a pulse signal to include four or more phases for programming and erasing the SONOS memory, as described herein, the endurance, data retention or both of the SONOS memory cell may be improved. The pulse signal can be shaped according to various embodiments. For example some possible pulse-shaping embodiments are: 1) Slow ramp for a program/erase (P/E) cycle; 2) longer time, lower voltage for P/E cycle; 3) Staircase pulse shape to reach final P/E voltage in a P/E cycle; 4) Multiple pulses with increasing magnitudes (heights) to reach final P/E voltage in a P/E cycle; or the like. Several embodiments may also be combined e.g. multiple pulses with increasing magnitudes along with lower voltage, longer time for the final pulse. The use of P/E pulse shaping on SONOS memory cells may reduce peak electric field during P/E cycling. Although not usually visible through diagnostic techniques such as Scanning Electron Microscopy (SEM) and Transmission Electron Microscopy (TEM), it is generally accepted that such damage to the oxide-nitride-oxide layers results in degraded performance in endurance and retention characteristics. This has been linked to the formation of traps in these layers. These damage-related traps can reduce the amount of charge that gets programmed and erased into intentional traps in the memory element and thus reduce endurance. They can also provide a path for intentionally trapped charge to migrate away and thus impact retention. The pulse-shaping techniques as described herein can improve endurance and retention characteristics as described herein. In particular, the four or more phases in the pulse shape can inject the appropriate amount of charge without damaging the memory element. The pulse shape of the pulse signal can achieve the desired charge at a controlled rate, which may be slower than conventional pulse signals, but cause less damage. The slow ramp or staircase on a P/E pulse may cause less damage during endurance. The longer time, lower voltage pulse on a P/E pulse may also cause lower damage during cycling. Also, retention after endurance may also be improved using these pulse shaping techniques. As described herein, two of these different embodiments have been demonstrated improvement in endurance damage and end-of-life VT window on 65 nm SONOS technology. In the different embodiments, a pulse shape of the pulse signal to program/erase is controlled during pulse shaping in order to lower voltages to program/erase the SONOS memory or to allow the VT to change before the voltage of the pulse signal gets to a final P/E value. This reduces the damage caused on the SONOS memory cell, increasing endurance of the SONOS memory cell. Also, as described herein, controlling the pulse shape of the pulse signal can improve retention after endurance. This may allow the SONOS memory cell to be used in 100K/1M cycle applications. In some embodiments, the EOL window after 1M cycles and data retention of devices with pulse shaping has been improved by ~100 mV to almost match the un-cycled devices on the same wafer. It should be noted that the endurance specification can be improved (even achieving 1M cycles or more) for any of the SONOS technologies described herein. Also, the embodiments can be used in NVSRAMs, Flash, EEPROM applications in 65 nm technologies and future advanced technologies, having endurance specifications such as 100K or 1M cycles.

FIG. 1 illustrates pulse shaping 100 using ramped pulses with two different ramp rates for programming and erasing a SONOS memory cell according to one embodiment. In this embodiment, pulse shapes of pulse signals for P/E cycles are controlled as ramped pulses with four or more phases. In particular, in one embodiment, the ramped pulse has an initial rate and then a second ramp rate that is slower than the initial rate. The ramped pulse may also include a holding phase and one or more subsequent transition phase that decreases in magnitude. In the depicted embodiment, there are four phases: a first phase with the first ramp rate, a second phase with the second ramp rate, a third holding phase, and a fourth falling/rising phase. In another embodiment, the pulse signal has four or more phases by controlling multiple pulses in a multi-pulse signal as described herein. In another embodiment, the pulse signal has four or more phases in a staircase ramp signal. For example, in a staircase ramp signal, there may be multiple raising phases, holding phases, and falling phases.

In the depicted embodiment for an erase cycle 102, the pulse signal 101 has an initial rate 112, and a second rate 114 that is slower than the initial rate 112. In one embodiment, the second rate 114 results in a first ramp time 116 from an intermediate erase voltage 113 to an erase final voltage 118. In one embodiment, the intermediate erase voltage 113 is −3 volts, the final erase voltage 118 is −7.5 volts and the first ramp time 116 is 4 msec. Alternatively, other voltages and ramp times may be used to control a pulse shape with four or more phases.

In the depicted embodiment for a program cycle 104, the pulse signal 103 has an initial rate 122, and a second rate 124 that is slower than the initial rate 122. In one embodiment, the second rate 124 results in a second ramp time 126 from an intermediate program voltage 123 to a program final voltage 128. In one embodiment, the intermediate program voltage 123 is −3 volts, the final erase voltage 128 is −7.5 volts and the second ramp time 126 is 4 msec. In one embodiment, the first ramp time 116 and second ramp time 126 are the same by way of having the same second ramp rates 114 and 124. In another embodiment, different ramp rates may be used for the second ramp rates 114 and 124, which results in different ramp times 116 and 126. Alternatively, other voltages and ramp times may be used.

The pulse signal 101 for the erase cycle 102 and the pulse signal 103 for the program cycle 104 are ramped pulses. Ramped pulses can be used to effectively perform a soft P/E cycle, which programs or erases the SONOS memory to an intermediate VT by the time the pulse amplitude reaches the peak value, P/E final values 118, 128. As noted above, other voltages and ramp times may be used for different technologies. For example, these voltages and ramp times may be used for 65 nm technology and different ramp times may be used for 28 nm technologies—or even for different applications on the same technology (e.g. the NVSRAM may use a different ramp time or pulse shaping compared to the flash memory on the same technology). The results from the endurance cycling and data retention after cycling of pulse shaping with ramped pulses are illustrated and described with respect to FIG. 6.

In another embodiment, the pulse shaping can reduce the voltage during a P/E cycle, while increasing a time in which the VTP/VTE is kept constant. VTP is the programmed threshold voltage and VTE is the erased threshold voltage. As described herein, when the control gate of the SONOS memory cell is biased positively, electrons from the transistor source and drain regions tunnel through the oxide layer and get trapped in the silicon nitride. This results in an energy barrier between the drain and the source, raising the threshold voltage VT (the gate-source voltage necessary for current to flow through the transistor). The electrons can be removed again by applying a negative bias on the control gate. By controlling an overall pulse duration of the pulse signal, the pulse shape of the pulse signal can be controlled. As a result, a lower voltage for the P/E cycle can be used. The lower voltage causes less damage to the SONOS memory over time. These embodiments can also be used in connection with one of the other pulse shaping techniques.

In one embodiment for pulse shaping with a longer time, lower voltage for a P/E cycle, a first pulse signal of 7.25 V with an overall pulse duration of 3 msec is used for programming the SONOS memory cell and a second pulse signal of −7.2 V with an overall pulse duration of 10 msec is used for erasing the SONOS memory cell. Lower voltages are used, while the time to keep the VTP/VTE constant is increased. The results from the endurance cycling and data retention after cycling of pulse shaping with lower voltages over longer times are illustrated and described with respect to FIG. 7.

Figure 2:
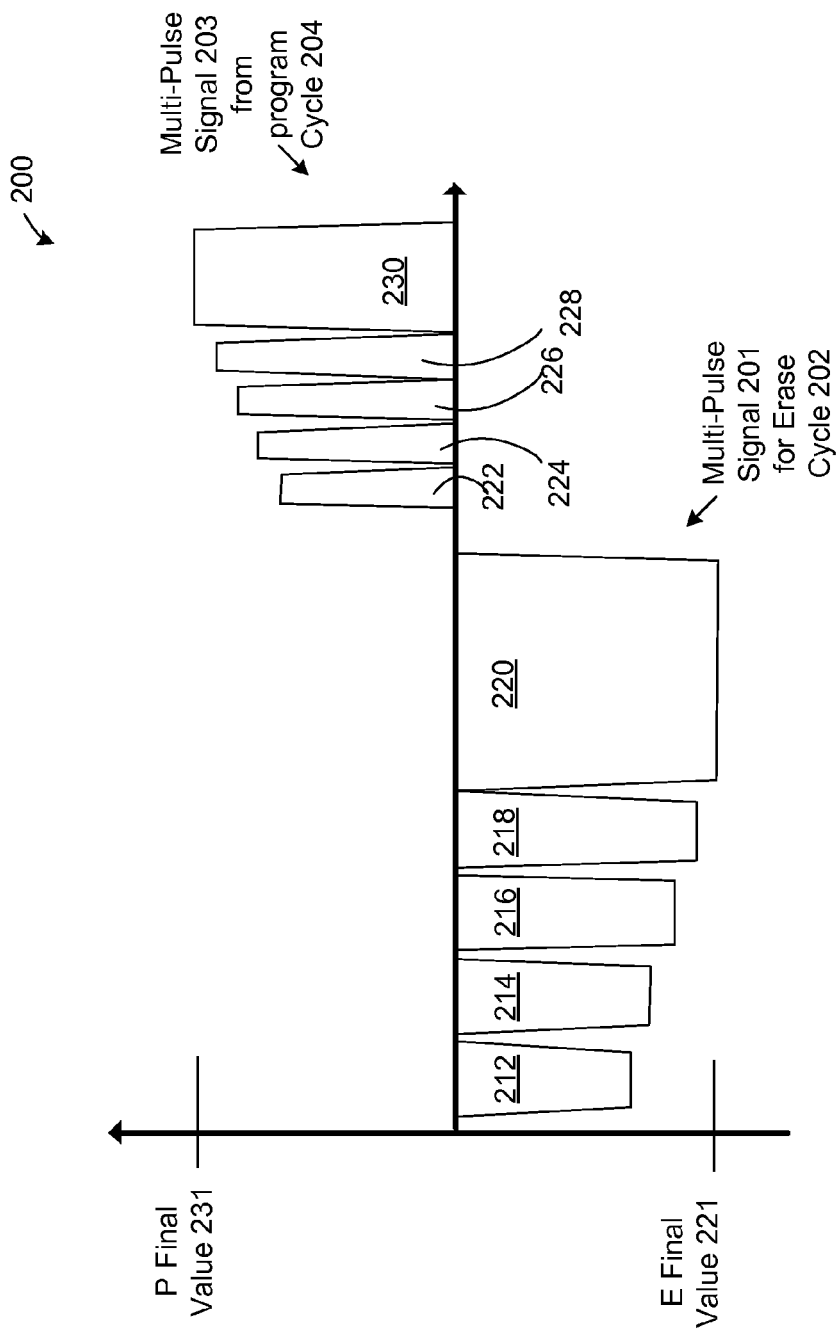
FIG. 2 illustrate pulse shaping using a pulse signal with multiple pulses of varying magnitudes and varying durations for programming and erasing a SONOS memory cell according to another embodiment.

FIG. 2 illustrate pulse shaping 200 using a pulse signal with multiple pulses of varying magnitudes and varying durations for programming and erasing a SONOS memory cell according to another embodiment. In this embodiment, pulse shapes of pulse signals for P/E cycles are controlled as multi-pulse signals for the four or more phases. In particular, a multi-pulse signal includes multiple pulses with varying magnitudes and durations. That is the multiple pulses are used for the four or more phases of the pulse shape to gradually program or erase the SONOS memory cell.

In the depicted embodiment for an erase cycle 202, a multi-pulse signal 201 includes five pulses 212-220. The first pulse 212 has a first voltage magnitude. The second pulse 214 has a second voltage magnitude that is greater than the first voltage magnitude. Since this is for the erase cycle 202 where negative voltages are used, the second pulse 214 has a lower negative voltage than the first pulse 212. The third pulse 216 has a third voltage magnitude that is greater than the second voltage magnitude. The fourth pulse 218 has a fourth voltage magnitude that is greater than the third voltage magnitude. The fifth pulse 220 has a fifth voltage magnitude that is greater than the fourth voltage magnitude. In effect the voltage magnitude increases incrementally (amount of negative voltage decreases) for each pulse of the multi-pulse signal 201. It can be said that the multiple pulses increase in pulse height (higher voltage magnitude) for successive pulses. In this embodiment, the first four pulses 212-218 have substantially the same duration, and the fifth pulse 220 has a longer duration than the first four pulses. The fifth pulse 220 reaches the E final value 221. In another embodiment, the pulses may have the same durations or different durations. In another embodiment where there are more than two pulses in the multi-pulse signal 201, the last two pulses of the multi-pulse signal 201 may be longer than the previous pulses.

In the depicted embodiment, the multi-pulse signal 201 includes five pulses for the erase cycle 202. Alternatively, other number of pulses may be used in the multi-phase signal 201. In one embodiment, the first four pulses 212-218 have durations of 400 μsec and the fifth pulse 220 has a duration of approximately 1 msec to 1.5 msec. In another embodiment, the five pulses 212-220 have voltages of −5V, −5.75V, −6.5V, −7.25V and −7.5V respectively. Although in this embodiment, the program time is shorter than erase, in other embodiments, the program time may be longer or the same as the erase time. Alternatively, other voltage magnitudes may be used for the pulses of the multi-pulse signal 201.

In the depicted embodiment for a program cycle 204, a multi-pulse signal 203 includes five pulses 222-230. The first pulse 222 has a first voltage magnitude. The second pulse 224 has a second voltage magnitude that is greater than the first voltage magnitude. Since this is for the program cycle 204 where positive voltages are used, the second pulse 224 has a higher positive voltage than the first pulse 222. The third pulse 226 has a third voltage magnitude that is greater than the second voltage magnitude. The fourth pulse 228 has a fourth voltage magnitude that is greater than the third voltage magnitude. The fifth pulse 230 has a fifth voltage magnitude that is greater than the fourth voltage magnitude. In effect the voltage magnitude increases incrementally (amount of positive voltage increases) for each pulse of the multi-pulse signal 203. The fifth pulse 230 reaches the P final value 231. Like the multi-pulse signal 201, the multiple pulses of the multi-pulse signal 203 increase in pulse height (higher voltage magnitude) for successive pulses. In this embodiment, the first four pulses 222-228 have substantially the same duration, and the fifth pulse 230 has a longer duration than the first four pulses. In another embodiment, the pulses may have the same durations or different durations. In another embodiment where there are more than two pulses in the multi-pulse signal 203, the last two pulses of the multi-pulse signal 203 may be longer than the previous pulses.

In the depicted embodiment, the multi-pulse signal 203 includes five pulses for the program cycle 204. Alternatively, other number of pulses may be used in the multi-phase signal 203. In one embodiment, the first four pulses 222-228 have durations of 400 μsec and the fifth pulse 220 has a duration of approximately 1 msec to 1.5 msec. In another embodiment, the five pulses 212-220 have voltages of −5V, −5.75V, −6.5V, −7.25V and −7.5V respectively. Alternatively, other voltage magnitudes may be used for the pulses of the multi-pulse signal 201.

The multi-pulse signal 201 for the erase cycle 202 and the multi-pulse signal 203 for the program cycle 204 can be used as way to control a pulse shape of a pulse signal for P/E cycles. In particular, the multi-pulse signal 201 can be used to control the pulse shape to include multiple positive edge rates for programming the SONOS memory cell and the multi-pulse signal 203 can be used to control the pulse shape to include multiple negative edge rates for erasing the SONOS memory cell. Multi-pulse signals can be used to effectively reduce endurance damage in Flash memories in general, and more specifically to reduce endurance damage in SONOS memory cells. The multi-pulse signals can be used in the various SONOS technologies described herein. The results from the endurance cycling and data retention after cycling of pulse shaping with multiple pulses are illustrated and described with respect to FIG. 8.

Figure 3:
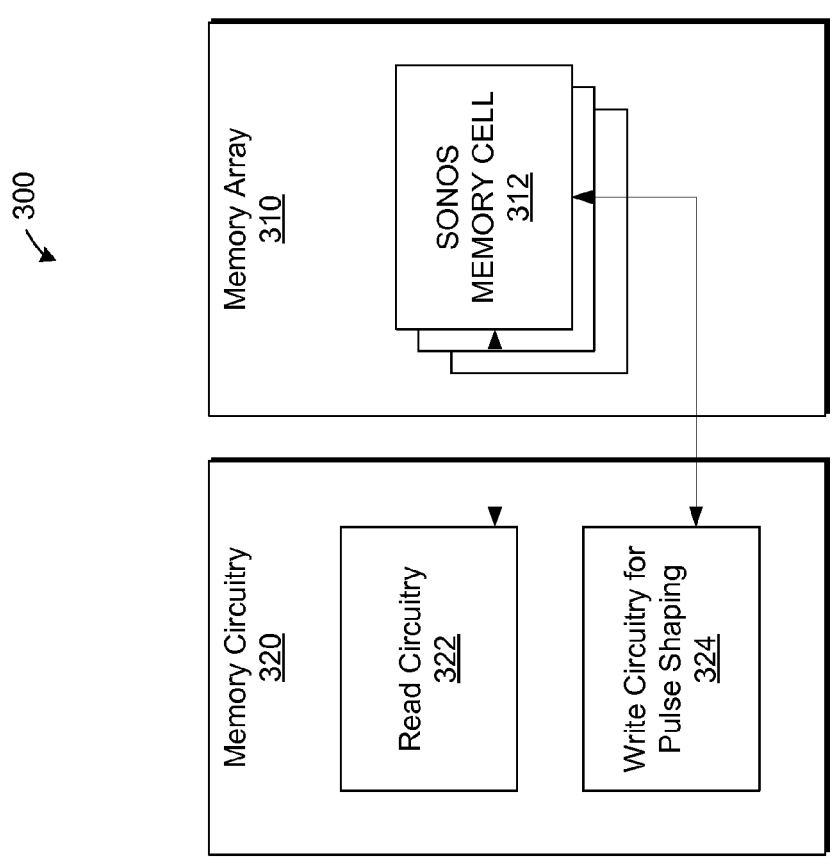
FIG. 3 is a block diagram illustrating a memory device including a SONOS memory array and memory circuitry for programming and erasing SONOS memory cells according to one embodiment.

FIG. 3 is a block diagram illustrating a memory device 300 including a SONOS memory array 310 and memory circuitry 320 for programming and erasing SONOS memory cells according to one embodiment. The SONOS memory array 310 is constructed by fabricating a grid of SONOS transistors (referred to as SONOS memory cells 312) which are connected by horizontal and vertical control lines (wordlines and bitlines) to the peripheral memory circuitry 320 (sometimes referred to as a memory controller). The peripheral memory circuitry 320 includes read circuitry 322 and write circuitry 324 for pulse shaping write cycles (also referred to herein as P/E cycles) for programming and erasing the SONOS memory cells 312. The memory circuitry 320 may include address decoder(s), sense amplifier(s), charge pump(s) or the like. One embodiment of a bi-directional charge pump is described below with respect to FIG. 4. The write circuitry 324 can write to the SONOS memory cell 312 by positively biasing the gate of the SONOS memory cell 312. For example, in order to write, power may be built up in a charge pump, which can multiply an input voltage to a high voltage (HV OUT), for example, between 5V to 8V. As described herein, in some embodiments, lower voltages can be used to program the SONOS memory cell 312. After storing or erasing the cell, the read circuitry 322 can measure the state of the memory cell 312 by passing a small voltage across the source-drain nodes; if current flows the memory cell 312 is in the "no trapped electrons" state, which is considered a logical "0." If no current flows, the memory cell 312 is in the "trapped electrons" state, which is considered as "1" state. It should be noted that writing the SONOS memory cell 312 takes some time, meaning that the write cycle may be slower than the reading cycle and, in some cases, 100 to 1000 times slower.

In one embodiment, the charge pump of the write circuitry 324 includes analog ramp circuitry to control pulse shaping during P/E cycles, such as to control the ramp or staircase waveform during P/E cycles. In another embodiment, a digital-to-analog (DAC) can be used on a regulator of the charge pump can be used to pulse shape during P/E cycles. In another embodiment, a state machine or micro-code can be used to control pulse shaping during P/E cycles. A ramp control circuit having a DAC is illustrated and described with respect to FIG. 4 below.

Figure 4:
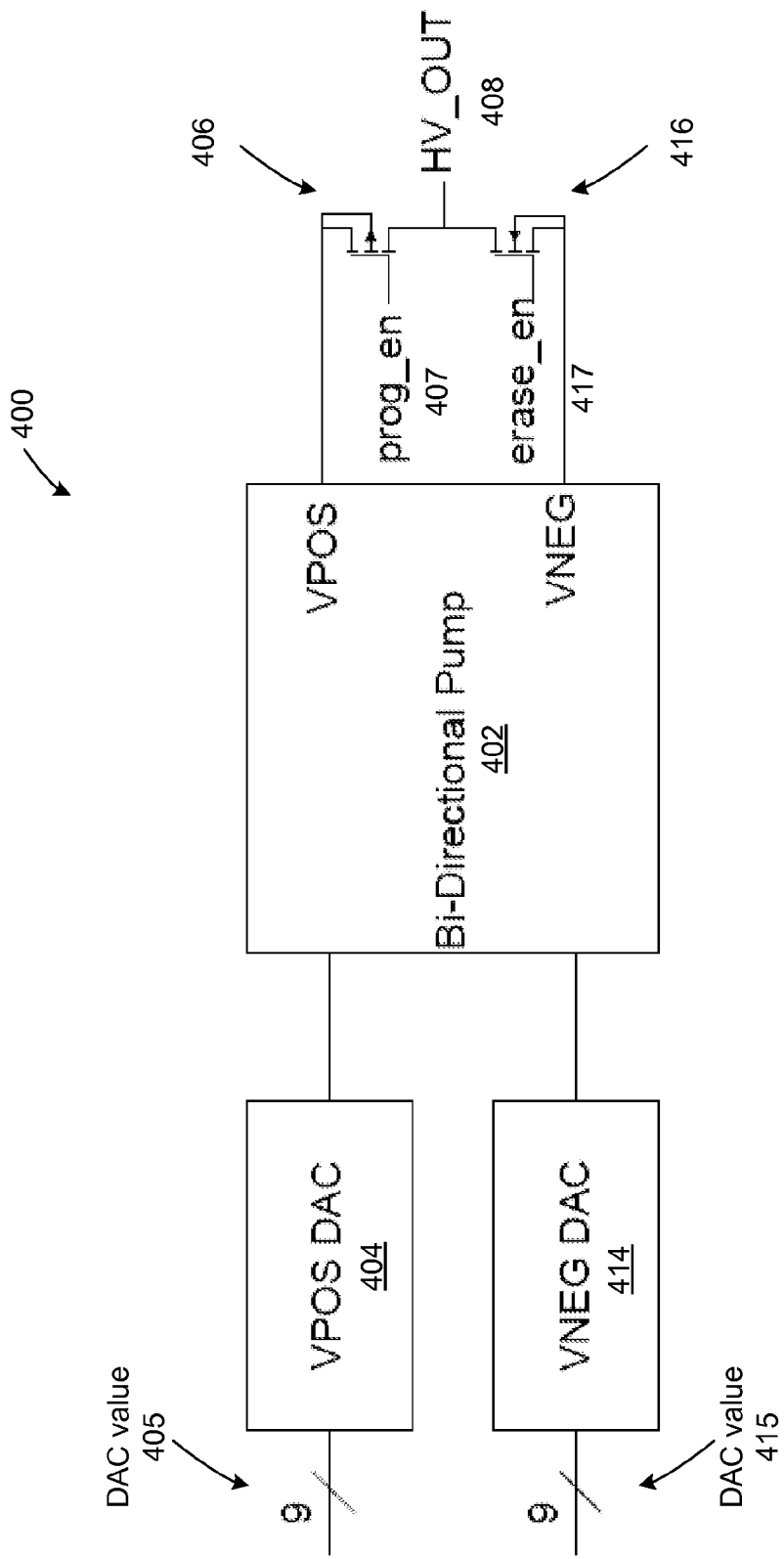
FIG. 4 is a block diagram illustrating a ramp control circuit for programming a SONOS memory cell according to one embodiment.

FIG. 4 is a block diagram illustrating a ramp control circuit 400 for programming a SONOS memory cell according to one embodiment. The ramp control circuit 400 includes a bi-directional charge pump 402, a first DAC 404, a second DAC 414, a first power transistor 406 and a second power transistor 416. In this embodiment, a processing element configured to pulse shape for programming the SONOS memory cell sends a first DAC value 405 (also referred to as a first DAC code) to the first DAC 404 for the positive voltage pulse shaping. The processing element configured to pulse shape for erasing the SONOS memory cell sends a second DAC value 415 (a second DAC value) to the second DAC 414 for the negative voltage pulse shaping. The processing element may be a processor, a memory controller, a controller, a processing element executing micro-code, a processing element implementing a state machine, or the like. In one embodiment, the processing element is a processing core of the Programmable System on a Chip (PSoC®) device for NVSRAM applications, developed by Cypress Semiconductor of San Jose, Calif. The PSoC® device may include configurable blocks to implement the components of FIG. 4, including the bi-directional charge pump 402, DACs 404 and 414, power transistors 406 and 416 another other components for the read and write circuitry, such as sense amplifiers or the like. Alternatively, the processing element may be the processing element of other types of programmable logic devices, ASIC devices, microprocessors, microcontrollers or the like.

In one embodiment, the positive ramp of the pulse signal for programming can be controlled by the first DAC value 405. The first DAC 404 converts the first DAC value 405 to an analog value for the bi-directional charge pump 402 that outputs a high voltage output 408 (positive high voltage output) when the first power transistor 406 is enabled. The first power transistor 406 can be enabled by a program enable signal 407 received at the gate of the first power transistor 406. The program enable signal 407 can also be received from the processing element that sends the first DAC value 405. In another embodiment, the program enable signal 407 can be received from another component in the system. Similarly, the negative ramp of the pulse signal for erasing can be controlled by the second DAC value 415. The second DAC 414 converts the second DAC value 415 to an analog value for the bi-directional charge pump 402 that outputs the high voltage output 408 (negative high voltage output) when the second power transistor 416 is enabled. The second power transistor 416 can be enabled by an erase enable signal 417 received at the gate of the second power transistor 416. The erase enable signal 417 can also be received from the processing element that sends the second DAC value 415. In another embodiment, the erase enable signal 417 can be received from another component in the system.

The bi-directional charge pump 402 can be controlled by the DAC values 405 and 415 to generate ramp pulses as described above. The bi-directional charge pump 402 can also be controlled by the DAC values 405 and 415 to generate a staircase pulse signal. The staircase pulse signal can give a pseudo ramp for P/E cycles of the NVRAM cell. Alternatively, the bi-directional charge pump 402 can be used to create the multiple pulses of the multi-pulse signals as described above.

Figure 5:
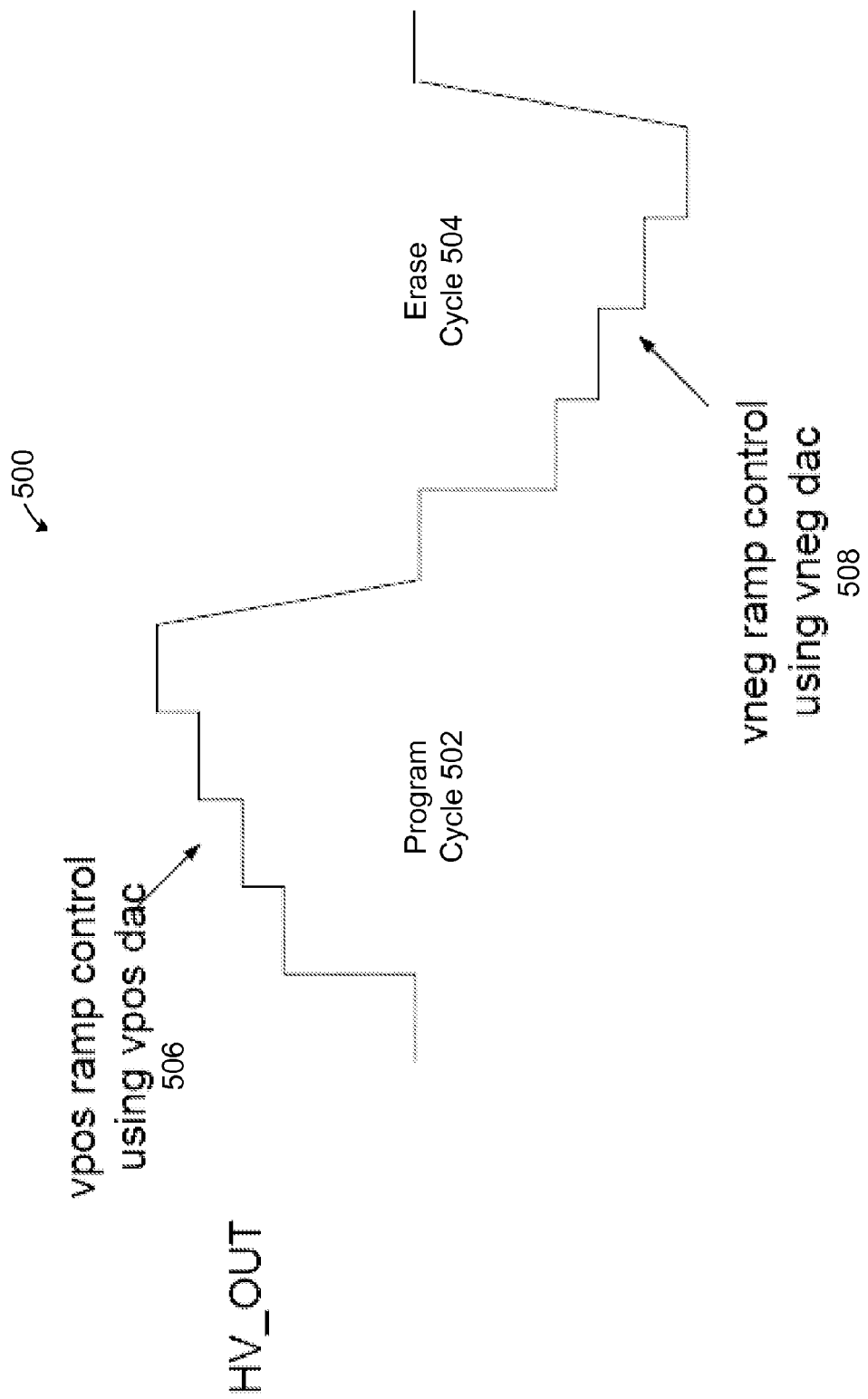
FIG. 5 illustrates a graph illustrating pulse shaping a pulse signal with a staircase signal for programming and erasing a SONOS memory cell according to another embodiment.

FIG. 5 illustrates a graph 500 illustrating pulse shaping a pulse signal with a staircase signal for programming and erasing a SONOS memory cell according to another embodiment. The graph 500 illustrates a program cycle 502 in which the ramp control circuit 400 of FIG. 4 generates a staircase 506 using the first DAC values 405. The graph 500 also illustrates an erase cycle 504 in which the ramp control circuit 400 generates a staircase 508 using the second DAC values 415.

Figure 6:
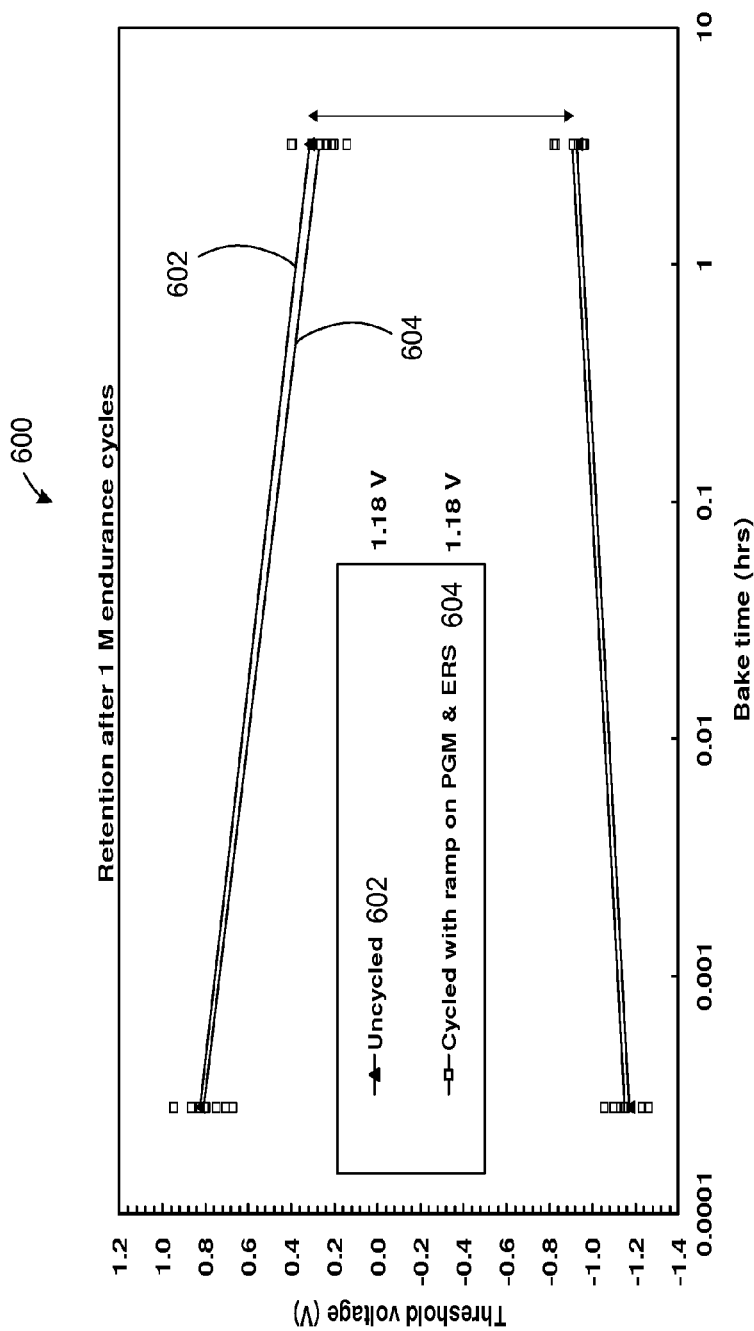
FIG. 6 is a graph illustrating data retention characteristics of a SONOS memory cell with full pulse shaping and partial pulse shaping according to one embodiment.

FIG. 6 is a graph 600 illustrating data retention characteristics of a SONOS memory cell with full pulse shaping and partial pulse shaping according to one embodiment. The un-cycled cells 602 have an EOL VT window after bake equivalent to 85° C., 10 years, is approximately 1.18V. For the cells 604 that use pulse shaping, including a 4 ms P/E ramp time on both program cycles and erase cycles, the EOL VT window after 1M cycles is approximately 1.18V, similar to the un-cycled cells 604. For the cells that did not use pulse shaping (i.e., without the 4 ms ramp (100 msec ramp), the EOL VT window after 1M cycles is 1.08V (not illustrated). Thus, there is about 100 mV loss due to cycling damage. This demonstrates that the slower ramp substantially improves the endurance damage in SONOS and improves the end-of-life window.

Figure 7:
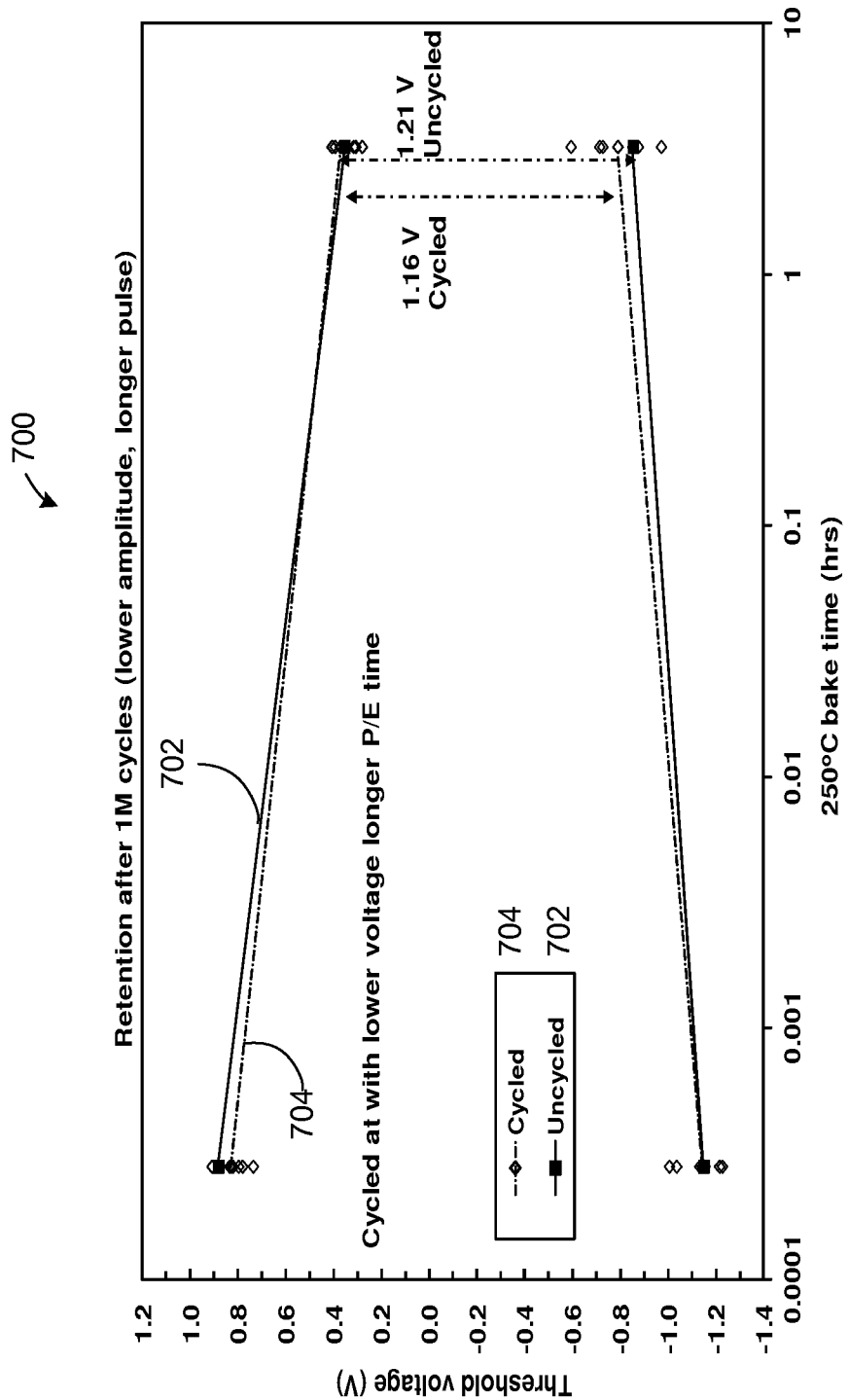
FIG. 7 is a graph illustrating data retention characteristics of a SONOS memory cell with pulse shaping a pulse signal with a lower voltage and longer duration according to another embodiment.

FIG. 7 is a graph 700 illustrating data retention characteristics of a SONOS memory cell with pulse shaping a pulse signal with a lower voltage and longer duration according to another embodiment. In this embodiment of pulse shaping to improve endurance, the voltage during P/E cycle is decreased while increasing the time to keep the VTP/VTE constant. To test this pulse shaping, a 7.25 V/–7.2 V, 3 msec/10 msec P/E pulse was used. The un-cycled cells 702 have an EOL VT window after bake equivalent to 85° C., 10 years of approximately 1.21V. For the cells 704 that use pulse shaping, including a lower voltage and longer duration both program cycles and erase cycles, the EOL VT window after 1M cycles is approximately 1.16V. This approach gets close to the un-cycled cell window of 1.21V.

Figure 8:
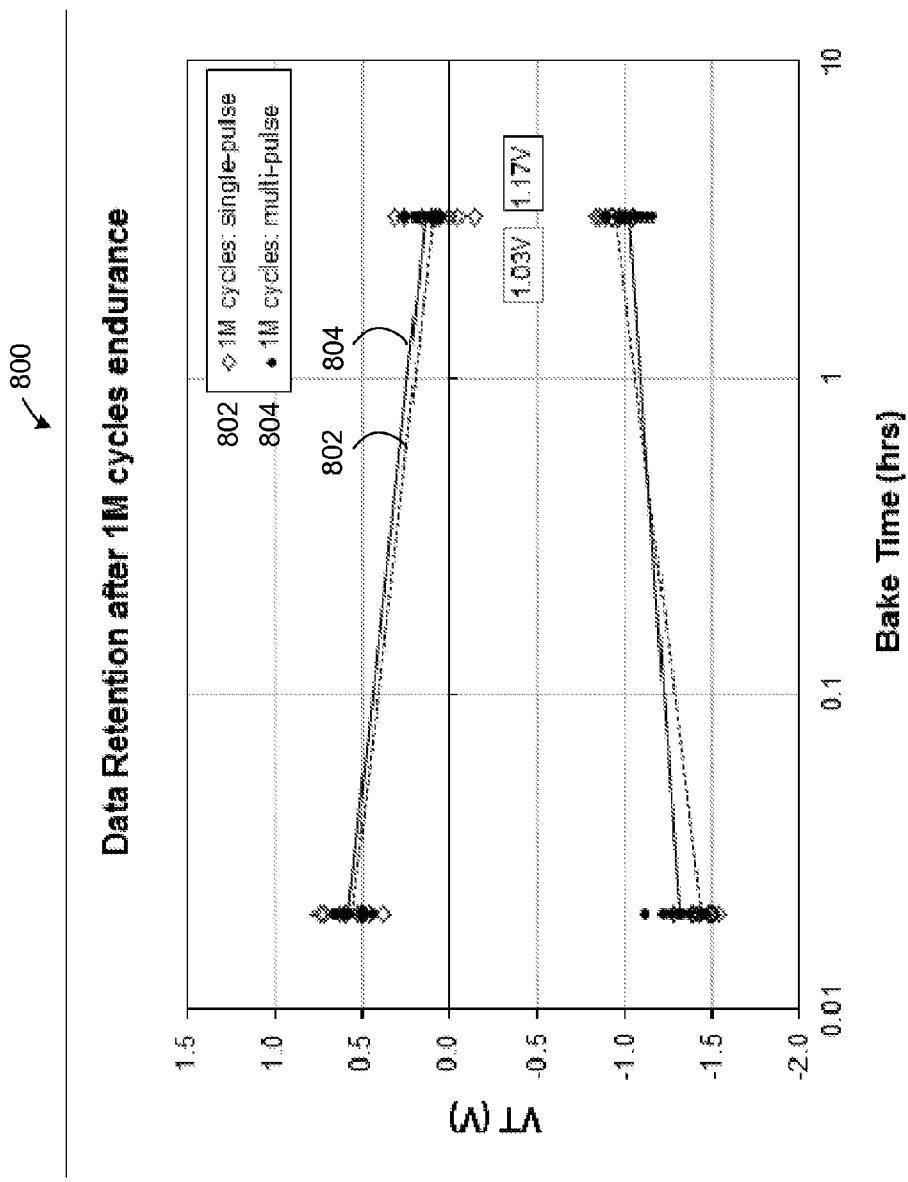
FIG. 8 is a graph illustrating data retention characteristics of a SONO memory cell with pulse shaping with multiple pulses according to another embodiment.

FIG. 8 is a graph 800 illustrating data retention characteristics of a SONO memory cell with pulse shaping with multiple pulses according to another embodiment. In this embodiment of pulse shaping to improve endurance, multiple pulses are used. To test this pulse shaping, a single-pulse cycled cells 802, have an EOL VT window after bake equivalent to 85° C., 10 years of approximately 1.03V. For the multi-pulse cells 804 that use multi-pulse shaping, the EOL VT window after 1M cycles is approximately 1.17V.

It should be noted that these voltages are used as example results of typical voltages used for cycling, but in other embodiments, other EOL VT windows may result when different voltages are used during programming and erasing the cell. Other pulse voltages, pulse widths etc. may also be used in different technologies.

Figure 9:
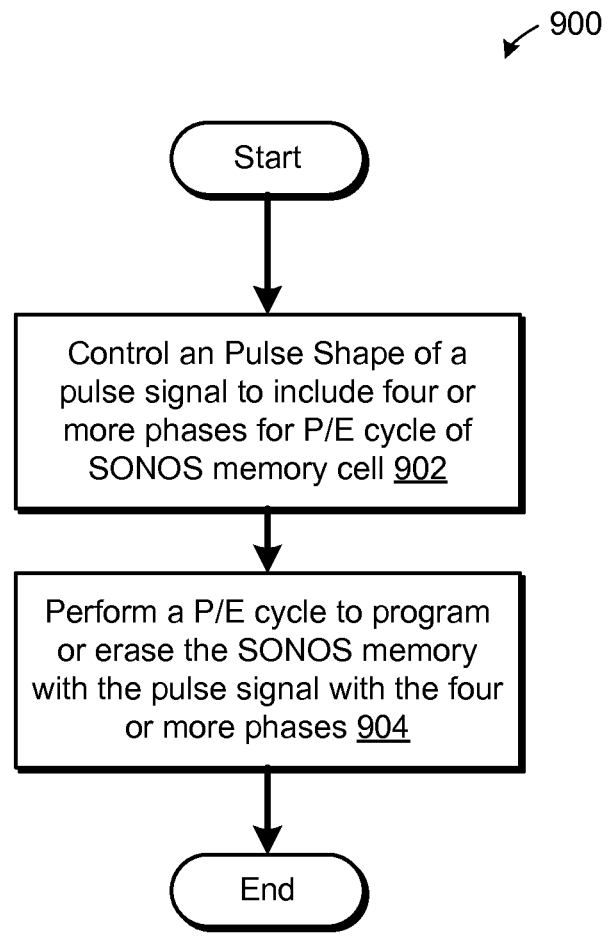
FIG. 9 is a flow diagram of a method of controlling a pulse shape of a pulse signal to include four or more phases for programming or erasing a SONOS memory cell according to an embodiment.

FIG. 9 is a flow diagram of a method 900 of controlling a pulse shape of a pulse signal to include four or more phases for programming or erasing a SONOS memory cell according to an embodiment. The method 900 may be performed by processing logic that may comprise hardware (circuitry, dedicated logic, etc.), software (such as is run on a general purpose computing system or a dedicated machine), firmware (embedded software), or any combination thereof. In one embodiment, the memory circuitry 310 of FIG. 3 performs the method 900. In another embodiment, the write circuitry 314 of FIG. 3 performs the method 900. In another embodiment, a processing element, such as described with respect to FIG. 4 that controls the bi-directional charge pump 402 and DACs 404 and 414, performs the method 900. In another embodiment, an address decoder 1020 of FIG. 10 performs the method 900. Alternatively, other components of systems including the SONOS memory cells may be configured to perform some or all of the method 900.

Referring to FIG. 9, the method 900 begins with the processing logic controlling a pulse shape of a pulse signal to include four or more phases for programming or erasing a SONOS memory cell (block 902). The processing logic then performs a write cycle (also referred to herein as P/E cycle) to program or erase the SONOS memory with the pulse signal with the four or more phases (block 904) and the method 900 ends. This method 900 can be repeated for each write cycle performed on the SONOS memory cell. In another embodiment, the method 900 is performed for an array of SONOS memory cells as described herein.

In one embodiment, the processing logic controls the pulse shape of the pulse signal by controlling a first ramp rate of the pulse signal during the write cycle and controlling a second ramp rate of the pulse signal during the write cycle. The first ramp rate may correspond to a first phase of the four or more phases and the second ramp rate may correspond to a second phase of the four or more phases. In one embodiment, the first ramp rate is faster than the second ramp rate. In a further embodiment, the four or more phases include a holding phase and one or more subsequent phases in which the magnitude is decreased from the holding phase. In another embodiment, the processing logic controls the pulse shape of the pulse signal by controlling a staircase ramp of the pulse signal during the write cycle. In another embodiment, the processing logic controls the pulse shape of the pulse signal by creating a sequence of increasing pulses during the write cycle. The sequence of increasing pulses include the four or more phases. In a further embodiment, the processing logic controls the pulse shape by controlling an overall pulse duration of the pulse signal. In this embodiment, a lower voltage may be used for the write cycle.

In another embodiment, the processing logic controls the pulse shape of the pulse signal by creating a first pulse with a first magnitude for a first duration during the write cycle. The processing logic also creates a second pulse with a second magnitude for a second duration during the write cycle. The second magnitude is different than the first magnitude and the first duration is different than the second duration. In another embodiment, the processing logic controls the pulse shape of the pulse signal by creating multiple pulses of varying magnitudes and varying durations during the write cycle. In one embodiment, the processing logic creates a first sequence of pulses with incremental adjustments in magnitude. The first sequence of pulses may have substantially similar durations. The processing logic creates a subsequent pulse with an incremental adjustment in magnitude. The subsequent pulse may have a longer duration than the substantially similar durations of the first sequence.

Figure 10:
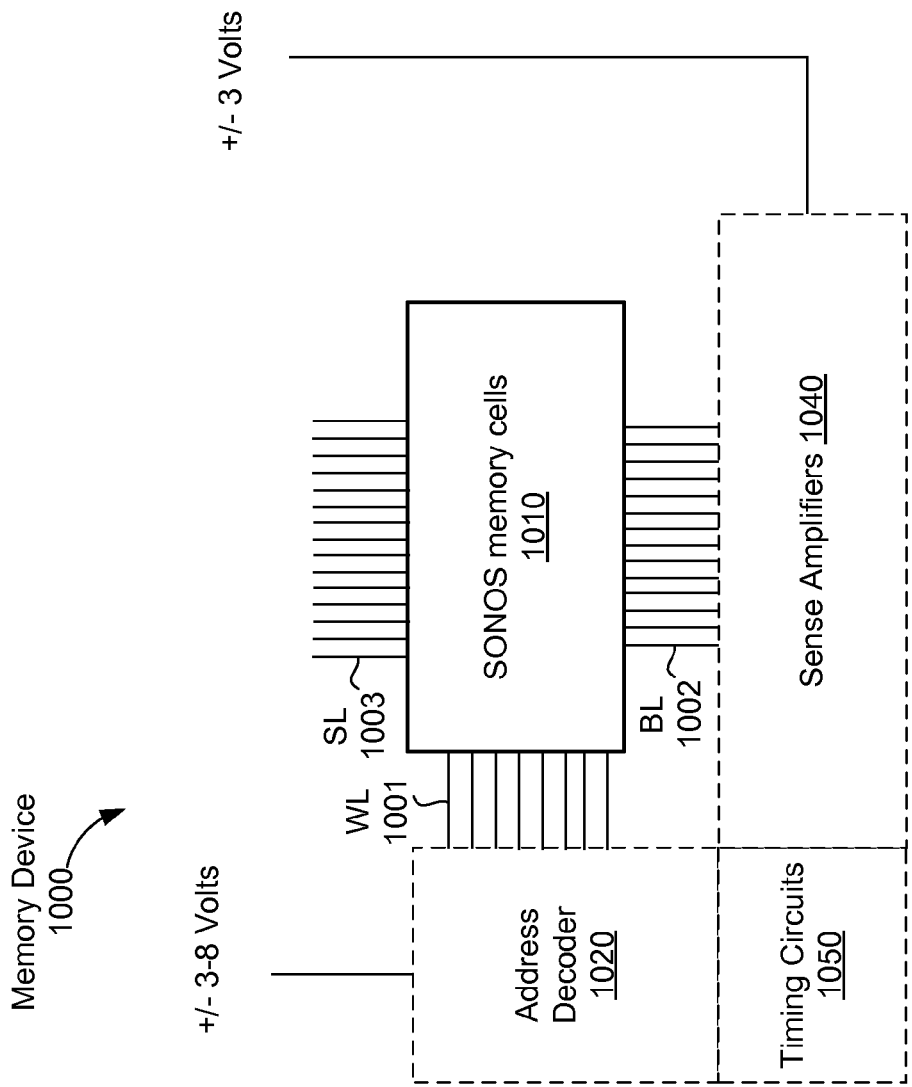
FIG. 10 is a block diagram illustrating a memory device including SONOS memory cells and peripheral circuitry according to one embodiment.

FIG. 10 is a block diagram illustrating a memory device including SONOS memory cells and peripheral circuitry according to one embodiment. The memory device 1000 contains an array 1010 of SONOS memory cells as described herein, address decoder 1020, one or more sense amplifiers 1040, and timing circuits 1050. Each SONOS memory of the array 1010 includes a word line 1001, a bit line 1002, a source line 1003. The word line 1001 is coupled to a gate of the SONOS memory cell and the bit line 1002 and source line 1003 are coupled to the drains and sources of the SONOS memory cell. The source lines 1003 may be connected to multiple SONOS memory cells. The word lines 1001 and read bit lines 1002 of the array 1010 of SONOS memory cells are arranged into rows and columns, respectively. The bit lines 1002 of the memory array 1010 are connected to the one or more sense amplifiers 1040 and the word lines 1001 are connected to the address decoder 1020. The sense amplifiers 1040 may be controlled by the timing circuits 1050.

The control gate (word line 1001) is positively biased to program the SONOS memory and is negatively biased to erase the SONOS memory according to the particular pulse shaping technique described herein. After storing or erasing the cell, a memory controller can measure the state of the cell by passing a small voltage across the source-drain nodes and measuring the current flow by the sense amplifiers 1040. If current flows the cell must be in the "no trapped electrons" state, which is considered a logical "0." If no current is seen the cell must be in the "trapped electrons" state, which is considered as "1" state. The operations and various configurations of the address decoder 1020, sense amplifiers 1040, and the timing circuits 1050 of FIG. 10 would be understood by those of ordinary skill in the art; as such, additional description regarding their operations and configurations has not been included so as to not obscure the discussion of the present embodiments.

The embodiments of pulse shaping described herein may be used in various type of SONOS stacks. In other embodiments, the pulse shaping can be done on a small number of bits such as a sector, and the pulse shaping can move from sector to sector, such as after 10K cycles. For example, 10 sectors could be used to achieve 100K cycles. Also, as described herein, multiple different pulse shaping techniques may be used, such as a slow ramp for program/erase cycle, longer time and lower voltage programming, staircase pulse shaping to reach final P/E voltage, multiple pulses with increasing height to reach final P/E voltage, or the like. Also, the embodiments described herein may be applied to any SONOS technology or bit cell such as flash (1T or 2T), EEPROM or NVSRAM or NV latch.

In the above description, numerous details are set forth. It will be apparent, however, to one of ordinary skill in the art having the benefit of this disclosure, that embodiments of the present invention may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "encrypting," "decrypting," "storing," "providing," "deriving," "obtaining," "receiving," "authenticating," "deleting," "executing," "requesting," "communicating," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such.

Embodiments descried herein may also relate to an apparatus for performing the operations herein. This apparatus may be specially constructed for the required purposes, or it may comprise a general-purpose computer selectively activated or reconfigured by a computer program stored in the computer. Such a computer program may be stored in a non-transitory computer-readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, flash memory, or any type of media suitable for storing electronic instructions. The term "computer-readable storage medium" should be taken to include a single medium or multiple media (e.g., a centralized or distributed database and/or associated caches and servers) that store the one or more sets of instructions. The term "computer-readable medium" shall also be taken to include any medium that is capable of storing, encoding or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the embodiments as described herein.

The above description sets forth numerous specific details such as examples of specific systems, components, methods and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth above are merely exemplary. Particular implementations may vary from these exemplary details and still be contemplated to be within the scope of the present invention.

It is to be understood that the above description is intended to be illustrative and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A method comprising:
controlling a pulse shape of a pulse signal to include four or more phases for both programming and erasing a Silicon-Oxide-Nitride-Oxide-Silicon (SONOS) memory cell during a write cycle, wherein the controlling the pulse shape further includes
controlling a first ramp rate of the pulse signal, and
controlling a second ramp rate, which is different from the first ramp rate, of the pulse signal; and
performing the write cycle to program or erase the SONOS memory cell each with the pulse signal with the four or more phases.

2. The method of claim 1,
wherein the first ramp rate corresponds to a first phase of the four or more phases and the second ramp rate corresponds to a second phase of the four or more phases.

3. The method of claim 2, wherein the first ramp rate is faster than the second ramp rate.

4. The method of claim 2, wherein the four or more phases comprise a holding phase.

5. The method of claim 1, wherein the controlling the pulse shape of the pulse signal further comprises controlling an overall pulse duration of the pulse signal.

6. The method of claim 1, wherein the controlling the pulse shape of the pulse signal comprises:
creating a first pulse with a first magnitude for a first duration during the write cycle; and
creating a second pulse with a second magnitude for a second duration during the write cycle, wherein the second magnitude is different than the first magnitude and the first duration is different than the second duration.

7. The method of claim 6, wherein the controlling the pulse shape of the pulse signal comprises creating a plurality of additional pulses of varying magnitudes and varying durations during the write cycle.

8. An apparatus comprising:
a Silicon-Oxide-Nitride-Oxide-Silicon (SONOS) memory cell; and
write circuitry coupled to the SONOS memory cell, wherein the write circuitry is configured to:
control a pulse shape of a pulse signal to include four or more phases for both programming and erasing the SONOS memory cell;
control a first ramp rate of the pulse signal;
control a second ramp rate, which is different from the first ramp rate, of the pulse signal; and
perform a write cycle to program or erase the SONOS memory cell with the pulse signal with the four or more phases.

9. The apparatus of claim 8,
wherein the first ramp rate corresponds to a first phase of the four or more phases and the second ramp rate corresponds to a second phase of the four or more phases.

10. The apparatus of claim 9, wherein the first ramp rate is faster than the second ramp rate.

11. The apparatus of claim 8, wherein the write circuitry is configured to control an overall pulse duration of the pulse signal during the write cycle.

12. The apparatus of claim 8, wherein the write circuitry is configured to:
create a first pulse with a first magnitude for a first duration during the write cycle; and
create a second pulse with a second magnitude for a second duration during the write cycle, wherein the second magnitude is different than the first magnitude and the first duration is different than the second duration.

13. The apparatus of claim 12, wherein the write circuitry is configured to control creating a plurality of additional pulses of varying magnitudes and varying durations during the write cycle.

14. A memory device comprising:
an array of Silicon-Oxide-Nitride-Oxide-Silicon (SONOS) memory cells; and
memory circuitry coupled to the array of SONOS memory cells, wherein the memory circuitry comprises write circuitry, wherein the write circuitry is configured to:
control a pulse shape of a pulse signal to include four or more phases for both programming and erasing the SONOS memory cell;
control a first ramp rate of the pulse signal, which corresponds to a first phase of the four or more phases;
control a second ramp rate, which is different from the first ramp rate and corresponds to a second phase of the four or more phases, of the pulse signal; and
perform a write cycle to program or erase the SONOS memory cell each with the pulse signal with the four or more phases.

* * * * *